United States Patent
Sheu et al.

(10) Patent No.: US 11,081,580 B2
(45) Date of Patent: Aug. 3, 2021

(54) HIGH-VOLTAGE SEMICONDUCTOR DEVICES AND METHODS FOR MANUFACTURING THE SAME

(71) Applicant: NUVOTON TECHNOLOGY CORPORATION, Hsinchu (TW)

(72) Inventors: Gene Sheu, Taipei (TW); Vivek Ningaraju, Mysore (IN); Po-An Chen, Toufen (TW); Shaik Mastanbasheer, Taichung (TW); Pooja Ravindra Deshmane, Hsinchu (TW); Monika Bharti, Hsinchu (TW); Syed Neyaz Imam, Chandanpatti (IN)

(73) Assignee: Nuvoton Technology Corporation, Hsinchu Science Park (TW)

( * ) Notice: Subject to any disclaimer, the term of this patent is extended or adjusted under 35 U.S.C. 154(b) by 192 days.

(21) Appl. No.: 16/220,862

(22) Filed: Dec. 14, 2018

(65) Prior Publication Data
US 2020/0044080 A1 Feb. 6, 2020

(30) Foreign Application Priority Data
Jul. 31, 2018 (TW) .................... 107126487

(51) Int. Cl.
*H01L 29/78* (2006.01)
*H01L 29/66* (2006.01)
(Continued)

(52) U.S. Cl.
CPC ...... *H01L 29/7816* (2013.01); *H01L 29/0623* (2013.01); *H01L 29/0653* (2013.01);
(Continued)

(58) Field of Classification Search
CPC ............ H01L 29/7816; H01L 29/1083; H01L 29/1087; H01L 29/0878; H01L 29/66689;
(Continued)

(56) References Cited

U.S. PATENT DOCUMENTS 5,376,816 A * 12/1994 Nishigoori .......... H01L 27/0623
257/370
6,288,424 B1 * 9/2001 Ludikhuize .......... H01L 21/761
257/335
(Continued)

FOREIGN PATENT DOCUMENTS

| TW | 201314868 A | 4/2013 |
| TW | 201347182 A | 11/2013 |
| TW | 201631765 A | 9/2016 |

OTHER PUBLICATIONS

Taiwan Office Action with TW Search Report, issued in corresponding Taiwan Application No. 107126487 dated Jan. 4, 2019, 6 pages.
(Continued)

*Primary Examiner* — Michael M Trinh
(74) *Attorney, Agent, or Firm* — Muncy, Geissler, Olds & Lowe, P.C.

(57) ABSTRACT

A high-voltage semiconductor device includes a semiconductor substrate having a first conductivity type, and a first high-voltage well region disposed in the semiconductor substrate and having a second conductivity type that is opposite to the first conductivity type. The high-voltage semiconductor device also includes a first buried layer disposed on the first high-voltage well region and having the first conductivity type, and a second buried layer and a third buried layer disposed on the first high-voltage well region and having the second conductivity type, wherein the first buried layer is between the second buried layer and the third buried layer. The high-voltage semiconductor device further includes a source region and a drain region disposed on the first buried layer and having the second conductivity type.

20 Claims, 8 Drawing Sheets

(51) Int. Cl.
*H01L 29/06* (2006.01)
*H01L 29/10* (2006.01)

(52) U.S. Cl.
CPC ...... *H01L 29/1087* (2013.01); *H01L 29/1095* (2013.01); *H01L 29/66659* (2013.01); *H01L 29/66689* (2013.01)

(58) Field of Classification Search
CPC ............. H01L 29/42369; H01L 21/761; H01L 29/0623; H01L 29/0619; H01L 29/66681
See application file for complete search history.

(56) References Cited

U.S. PATENT DOCUMENTS

| | | | |
|---|---|---|---|
| 8,236,642 B2* | 8/2012 | Wei | H01L 29/7835 438/236 |
| 8,643,099 B2* | 2/2014 | Denison | H01L 29/66659 257/335 |
| 9,660,074 B2 | 5/2017 | Cai | |
| 9,947,786 B2* | 4/2018 | Kim | H01L 29/0688 |
| 2014/0065781 A1* | 3/2014 | Chen | H01L 29/0634 438/286 |
| 2015/0364471 A1* | 12/2015 | Chang | H01L 29/7816 257/338 |
| 2016/0240660 A1 | 8/2016 | Yue et al. | |
| 2016/0336442 A1* | 11/2016 | Nielsen | H01L 21/823892 |

OTHER PUBLICATIONS

Yang et al., Fully-isolated NLDMOS Behavior Investigation during Reverse Recovery of Parasitic Diodes, 27$^{th}$ International Symposium on Power Semiconductor Devices & IC's, May 10-14, 2015, Kowloon Shangri-La, Hong Kong; pp. 145-148.

Takeuchi et al., HBM Robustness Optimization of Full Isolated Nch-LDMOS for Negative Input Voltage using Unique Index Parameter, 29$^{th}$ International Symposium on Power Semiconductor Devices & IC's, published between May 28-Jun. 1, 2017 Sapporo; pp. 471-474.

Ko et al., Implementation of Fully Isolated Low Vgs nLDMOS with Low Specific On-resistance, 23$^{rd}$ International Symposim on Power Semiconductor Devices & IC's, May 23-26, 2011, San Diego, CA; pp. 24-27.

* cited by examiner

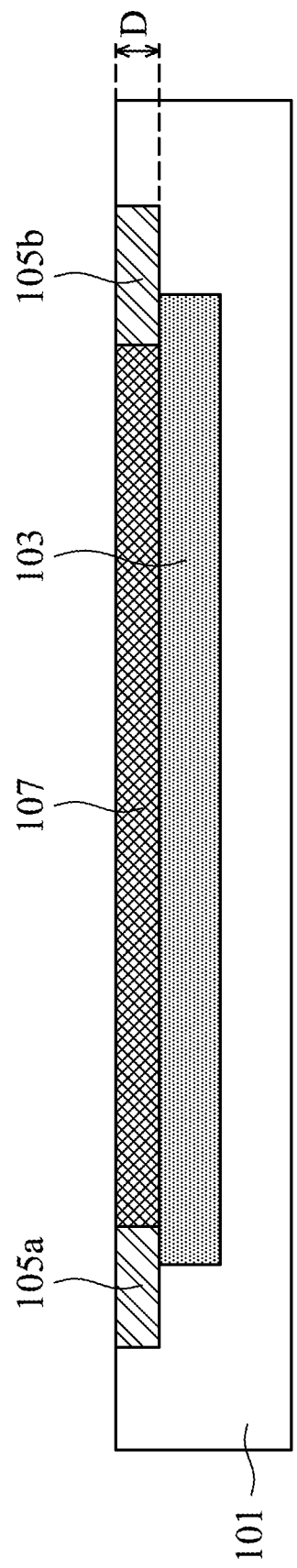

HIGH-VOLTAGE SEMICONDUCTOR DEVICES AND METHODS FOR MANUFACTURING THE SAME

CROSS REFERENCE TO RELATED APPLICATIONS

This Application claims priority of Taiwan Patent Application No. 107126487, filed on Jul. 31, 2018, the entirety of which is incorporated by reference herein.

BACKGROUND OF THE INVENTION

Field of the Invention

The invention relates to semiconductor devices, and in particular to high-voltage semiconductor devices and methods for manufacturing the same.

Description of the Related Art

High-voltage semiconductor devices are applied to integrated circuits with high voltage and high power. A traditional high-voltage semiconductor device, such as a vertically diffused metal oxide semiconductor (VDMOS) transistor or a laterally diffused metal oxide semiconductor (LDMOS) transistor, is mainly used in devices that operate on 18 volts or higher. The advantages of high-voltage device technology include cost effectiveness and process compatibility. High-voltage device technology has been widely used in display driver IC devices and power supply devices, as well as in the power management field, the communications field, the autotronics field, and industrial control.

Although existing high-voltage semiconductor devices and methods for manufacturing the same have been adequate for their intended purposes, they have not been entirely satisfactory in all respects. For example, if the structure of an element which has already been used in low-voltage devices is intended for application in a high-voltage device, the element will need to be redesigned. Moreover, the area taken up by the element will increase. Therefore, they are not able to meet the requirements of semiconductor device miniaturization, high breakdown voltage and low on-resistance. Accordingly, there are still some problems to be overcome in regards to high-voltage semiconductor devices and manufacturing technology.

BRIEF SUMMARY OF THE INVENTION

Embodiments of high-voltage semiconductor devices are provided in this disclosure, especially the embodiments of laterally diffused metal oxide semiconductor (LDMOS) transistors. In some embodiments of the present disclosure, a first high-voltage well region is disposed in a semiconductor substrate, the semiconductor substrate has a first conductivity type, and the first high-voltage well region has a second conductivity type that is opposite to the first conductivity type. A first buried layer, a second buried layer and a third buried layer are disposed on the first high-voltage well region. The first buried layer is located between the second buried layer and the third buried layer. The first buried layer has the first conductivity type, and the second buried layer and the third buried layer have the second conductivity type. In addition, a second high-voltage well region having the second conductivity type is disposed on the first buried layer, and a source region and a drain region having the second conductivity type are disposed in the second high-voltage well region.

The first high-voltage well region extends to the location below the second buried layer and the third buried layer. Therefore, a semiconductor device having high breakdown voltage is formed on the first high-voltage well region and is fully isolated from the semiconductor substrate. Moreover, since the first buried layer is disposed between the first high-voltage well region and the second high-voltage well region, the semiconductor device can withstand high voltage by utilizing the first high-voltage well region, and the semiconductor device can provide the voltage which is required to operate the semiconductor device itself. The laterally diffused metal oxide semiconductor transistor having high breakdown voltage can be widely applied in the chips of level shifters and high-voltage integrated circuits (HVICs). In addition, since the source region and the drain region are both disposed in the second high-voltage well region, the on-resistance ($R_{on}$) of the semiconductor device may be reduced. As a result, the on-state current of the laterally diffused metal oxide semiconductor transistor may be increased.

Some embodiments of the disclosure provide a high-voltage semiconductor device. The high-voltage semiconductor device includes a semiconductor substrate having a first conductivity type, and a first high-voltage well region disposed in the semiconductor substrate and having a second conductivity type that is opposite to the first conductivity type. The high-voltage semiconductor device also includes a first buried layer disposed on the first high-voltage well region and having the first conductivity type, and a second buried layer and a third buried layer disposed on the first high-voltage well region and having the second conductivity type, wherein the first buried layer is between the second buried layer and the third buried layer. The high-voltage semiconductor device further includes a source region and a drain region disposed on the first buried layer and having the second conductivity type.

Some embodiments of the disclosure provide a high-voltage semiconductor device. The high-voltage semiconductor device includes a semiconductor substrate having a first conductivity type, and a first high-voltage well region disposed in the semiconductor substrate and having a second conductivity type that is opposite to the first conductivity type. The high-voltage semiconductor device also includes a first buried layer disposed on the first high-voltage well region and having the first conductivity type, and a second high-voltage well region disposed on the first buried layer and having the second conductivity type. The high-voltage semiconductor device further includes a source region and a first drain region disposed in the second high-voltage well region and having the second conductivity type.

Some embodiments of the disclosure provide a method for manufacturing a high-voltage semiconductor device. The method includes forming a first high-voltage well region in a semiconductor substrate, wherein the semiconductor substrate has a first conductivity type, and the first high-voltage well region has a second conductivity type that is opposite to the first conductivity type. The method also includes forming a first buried layer on the first high-voltage well region, wherein the first buried layer has the first conductivity type, and forming a second buried layer and a third buried layer at opposite sides of the first buried layer, wherein the second buried layer and the third buried layer have the second conductivity type. The method further includes forming an epitaxial layer on the semiconductor substrate, wherein the first buried layer, the second buried layer and the third buried layer extend into the epitaxial layer, and forming a source region and a drain region in the epitaxial layer and on the first buried layer, wherein the source region and the drain region have the second conductivity type.

The semiconductor devices of the present disclosure may be applied to different types of semiconductor devices. In order to make the features and the advantages of the present disclosure more apparent and easy to understand, the embodiments of laterally diffused metal oxide semiconductor transistors are provided in the following descriptions with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIGS. 1A to 1F are cross-sectional views illustrating intermediate stages of a method for forming a high-voltage semiconductor device in FIG. 1F in accordance with some embodiments of the disclosure.

DETAILED DESCRIPTION OF THE INVENTION

Figure 1A:
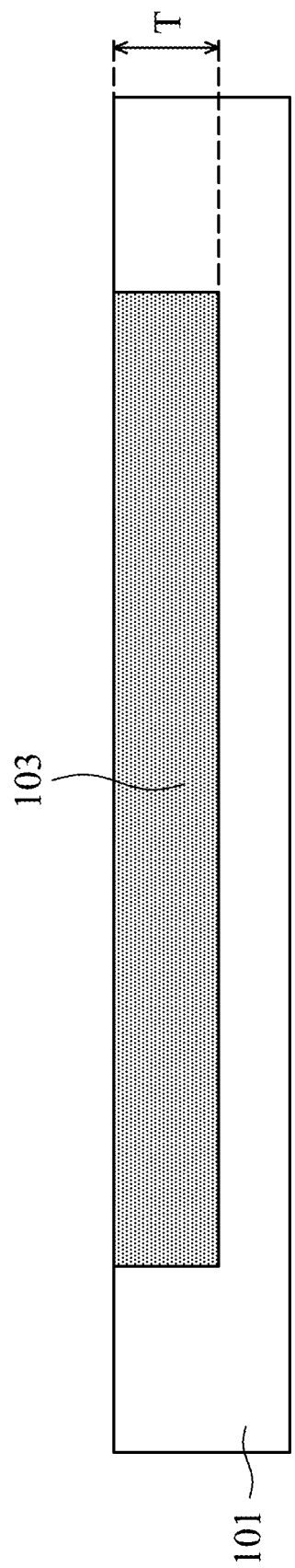

The following disclosure provides many different embodiments, or examples, for implementing different components of the semiconductor devices provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various figures and illustrative embodiments, like reference numbers are used to designate like elements. It should be understood that additional operations can be provided before, during, and after the method, and some of the operations described can be replaced or eliminated for other embodiments of the method.

FIGS. 1A to 1F are cross-sectional views illustrating intermediate stages of a method for forming a high-voltage semiconductor device 100 in accordance with some embodiments of the disclosure.

As shown in FIG. 1A, a first high-voltage well region 103 is formed in a semiconductor substrate 101, in accordance with some embodiment. The semiconductor substrate 101 may be made of silicon or other semiconductor materials. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide.

In addition, the semiconductor substrate 101 may include a silicon-on-insulator (SOI) substrate. In some embodiments, the semiconductor substrate 101 may be a lightly doped p-type or n-type substrate. In the present embodiment, the semiconductor substrate 101 is p-type, and the semiconductor substrate 101 has p-type dopants, such as boron (B). The high-voltage semiconductor device 100 formed subsequently may include an n-type laterally diffused metal oxide semiconductor transistor on the semiconductor substrate 101.

In some embodiments, the conductivity type of the first high-voltage well region 103 is opposite to the conductivity type of the semiconductor substrate 101. In the present embodiment, the semiconductor substrate 101 is p-type, and the first high-voltage well region 103 is n-type. In addition, the method of forming the first high-voltage well region 103 may include performing an ion implantation process in the semiconductor substrate 101 by using a mask to implant n-type dopants, such as phosphorous (P) or arsenic (As), and the dopant concentration is in a range from about $1\times10^{17}$ atoms/cm$^3$ to about $5\times10^{18}$ atoms/cm$^3$. Then, the implanted ions are driven in the semiconductor substrate 101 to form the first high-voltage well region 103.

Moreover, in some embodiments, the first high-voltage well region 103 has a thickness T which is perpendicular to the top surface of the semiconductor substrate 101, and the thickness T is greater than about 8 μm.

As shown in FIG. 1B, a first buried layer 107, a second buried layer 105a, and a third buried layer 105b are formed in the semiconductor substrate 101 and in the first high-voltage well region 103, in accordance with some embodiment. More specifically, the first buried layer 107, the second buried layer 105a, and the third buried layer 105b are formed in the semiconductor substrate 101 and in the upper portion of the first high-voltage well region 103, which is close to the top surface of the semiconductor substrate 101. After the first buried layer 107, the second buried layer 105a, and the third buried layer 105b are formed, the first buried layer 107, the second buried layer 105a, and the third buried layer 105b are located on the remaining first high-voltage well region 103. In the present embodiment, the first buried layer 107 is p-type, the second buried layer 105a and the third buried layer 105b are n-type. The methods used to form the first buried layer 107, the second buried layer 105a, and the third buried layer 105b are similar to, or the same as, those used to form the first high-voltage well region 103, and are not repeated herein. In some embodiments, the second buried layer 105a and the third buried layer 105b may be formed in the same process, and the second buried layer 105a and the third buried layer 105b may be formed before or after the first buried layer 107 is formed.

The second buried layer 105a and the third buried layer 105b are respectively located at opposite sides of the first buried layer 107. That is, the first buried layer 107 is located between the second buried layer 105a and the third buried layer 105b. In some embodiments, the first buried layer 107 is sandwiched between the second buried layer 105a and the third buried layer 105b, and the first high-voltage well region 103 extends below the second buried layer 105a and the third buried layer 105b. More specifically, the horizontal projection of the first buried layer 107 on the top surface of the semiconductor substrate 101 is entirely located in the area of the horizontal projection of the first high-voltage well region 103 on the top surface of the semiconductor substrate 101, and the horizontal projection of the first high-voltage well region 103 on the top surface of the semiconductor substrate 101 partially overlaps the horizontal projections of the second buried layer 105a and the third buried layer 105b on the top surface of the semiconductor substrate 101.

In addition, in some embodiments, the first buried layer 107, the second buried layer 105a and the third buried layer 105b have a thickness D which is perpendicular to the top surface of the semiconductor substrate 101, and the thickness D is greater than about 1 μm.

Figure 1C:
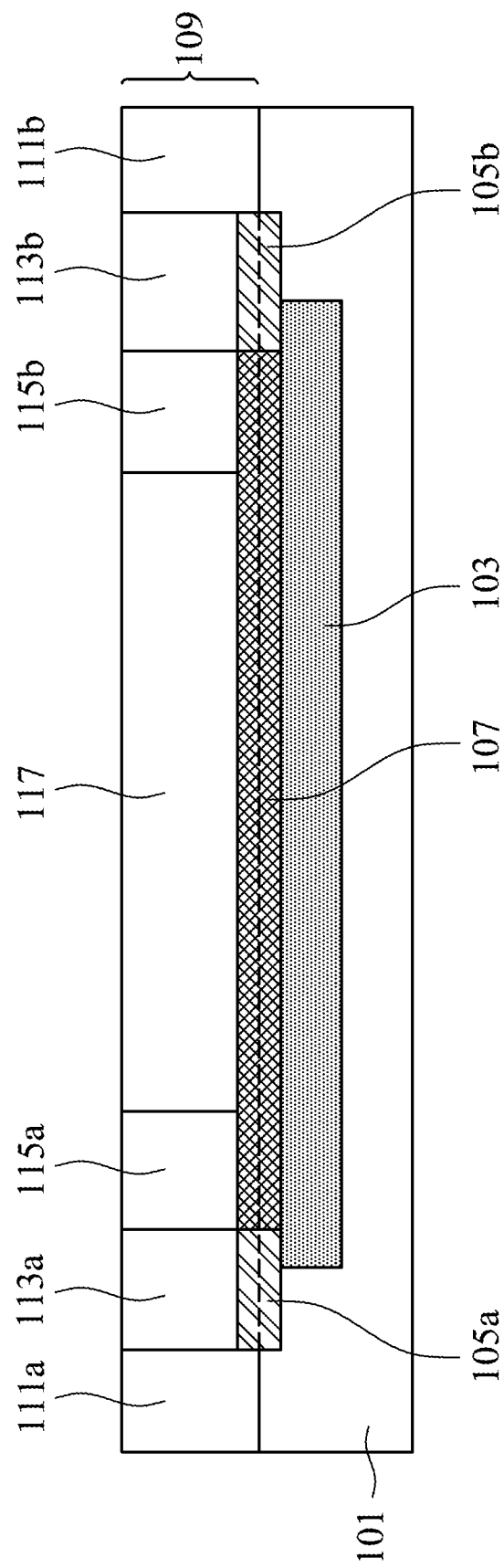

Next, as shown in FIG. 1C, an epitaxial layer 109 is formed on the semiconductor substrate 101. In some embodiments, the epitaxial layer 109 may be n-type or p-type. The epitaxial layer 109 may be formed by a metal organic chemical vapor deposition (MOCVD) process, a plasma-enhanced chemical vapor deposition (PECVD) process, a molecular beam epitaxy (MBE) process, a hydride vapor phase epitaxy (HVPE) process, a liquid phase epitaxy (LPE) process, a chloride-vapor phase epitaxy (Cl-VPE) process, another similar process or a combination thereof.

In some embodiments, the epitaxial layer 109 is formed at high temperature. Therefore, the previously implanted ions in the first buried layer 107, the second buried layer 105a and the third buried layer 105b may diffuse into the epitaxial layer 109. As shown in FIG. 1C, the first buried layer 107, the second buried layer 105a and the third buried layer 105b are located close to the interface between the semiconductor substrate 101 and the epitaxial layer 109. Each of the first buried layer 107, the second buried layer 105a and the third buried layer 105b has a portion inside the semiconductor substrate 101 and another portion inside the epitaxial layer 109.

In some embodiments, the dopant concentration of the first buried layer 107 is in a range from about $1\times10^{17}$ atoms/cm$^3$ to about $1\times10^{19}$ atoms/cm$^3$, and the dopant concentrations of the second buried layer 105a and the third buried layer 105b are in a range from about $5\times10^{16}$ atoms/cm$^3$ to about $1\times10^{19}$ atoms/cm$^3$. It should be noted that the dopant concentration of the first buried layer 107 is greater than the dopant concentration of the first high-voltage well region 103. In some embodiments, the dopant concentrations of the second buried layer 105a and the third buried layer 105b are greater than the dopant concentration of the first high-voltage well region 103. In addition, the dopant concentration of the first buried layer 107 is greater than the dopant concentration of the lightly doped semiconductor substrate 101.

Still referring to FIG. 1C, a second high-voltage well region 117, a third high-voltage well region 115a, a fourth high-voltage well region 113a, a fifth high-voltage well region 115b and a sixth high-voltage well region 113b are formed in the epitaxial layer 109. The second high-voltage well region 117, the third high-voltage well region 115a and the fifth high-voltage well region 115b are located on the first buried layer 107 and adjacent to the first buried layer 107. The fourth high-voltage well region 113a is located on the second buried layer 105a and adjacent to the second buried layer 105a. The sixth high-voltage well region 113b is located on the third buried layer 105b and adjacent to the third buried layer 105b.

In the present embodiment, the interface between the first buried layer 107 and the second buried layer 105a is aligned with the interface between the third high-voltage well region 115a and the fourth high-voltage well region 113a, and the interface between the first buried layer 107 and the third buried layer 105b is aligned with the interface between the fifth high-voltage well region 115b and the sixth high-voltage well region 113b. However, the locations are not limited thereto.

In some embodiments, the conductivity type of the second high-voltage well region 117 is the same as the conductivity type of the first high-voltage well region 103. In the present embodiment, the second high-voltage well region 117, the fourth high-voltage well region 113a and the sixth high-voltage well region 113b are n-type, and the third high-voltage well region 115a and the fifth high-voltage well region 115b are p-type. The methods used to form the second high-voltage well region 117, the third high-voltage well region 115a, the fourth high-voltage well region 113a, the fifth high-voltage well region 115b, and the sixth high-voltage well region 113b are similar to, or the same as, those used to form the first high-voltage well region 103, and are not repeated herein. It should be noted that the first buried layer 107 is sandwiched between the first high-voltage well region 103 and the second high-voltage well region 117.

Moreover, a high-voltage well region 111a and a high-voltage well region 111b may optionally be formed in the epitaxial layer 109. In some embodiments, the high-voltage well region 111a and the high-voltage well region 111b are p-type. The methods used to form the high-voltage well region 111a and the high-voltage well region 111b are similar to, or the same as, those used to form the first high-voltage well region 103, and are not repeated herein.

Figure 1D:
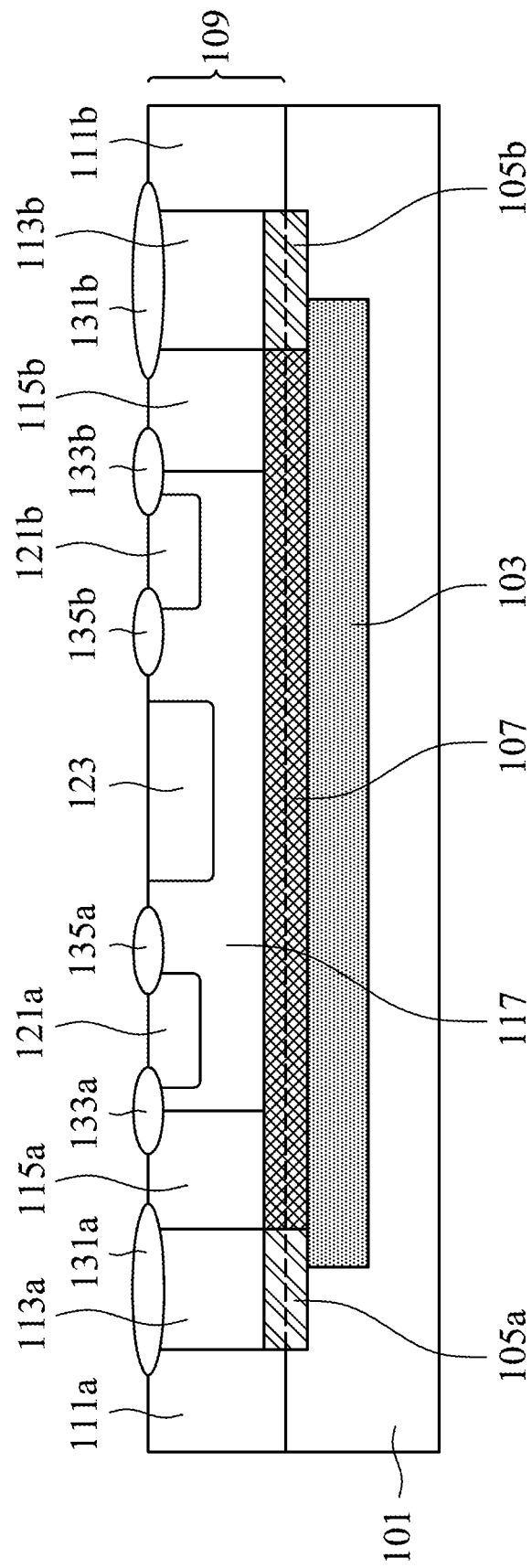

As shown in FIG. 1D, a well region 121a, a well region 123 and a well region 121b are formed in the second high-voltage well region 117 (the well region 123 is also called the body region). The well region 121a and the well region 121b have the same conductivity type, and the conductivity type of the well region 121a is opposite to the conductivity type of the well region 123. In the present embodiment, the well region 121a and the well region 121b are n-type, and the well region 123 is p-type. The methods used to form the well region 121a, the well region 123 and the well region 121b are similar to, or the same as, those used to form the first high-voltage well region 103, and are not repeated herein.

In some embodiments, the dopant concentrations of the well region 121a, the well region 123 and the well region 121b are greater than the dopant concentration of the second high-voltage well region 117. For example, the dopant concentrations of the well region 121a, the well region 123 and the well region 121b are in a range from about $5\times10^{16}$ atoms/cm$^3$ to about $5\times10^{18}$ atoms/cm$^3$, and the dopant concentration of the second high-voltage well region 117 is in a range from about $1\times10^{16}$ atoms/cm$^3$ to about $1\times10^{18}$ atoms/cm$^3$.

After the well region 121a, the well region 123, the well region 121b are formed in the second high-voltage well region 117, isolation structures 131a, 131b, 133a, 133b, 135a and 135b are formed on the epitaxial layer 109. More specifically, portions of the isolation structures 131a, 131b, 133a, 133b, 135a and 135b are embedded in the epitaxial layer 109. In some embodiments, the isolation structures 131a, 131b, 133a, 133b, 135a and 135b are made of silicon oxide, and the isolation structures 131a, 131b, 133a, 133b, 135a and 135b may be local oxidation of silicon (LOCOS) isolation structures which are formed by thermal oxidation. In other embodiments, the isolation structures 131a, 131b, 133a, 133b, 135a and 135b may be shallow trench isolation (STI) structures which are formed by etching and deposition processes.

Figure 1E:
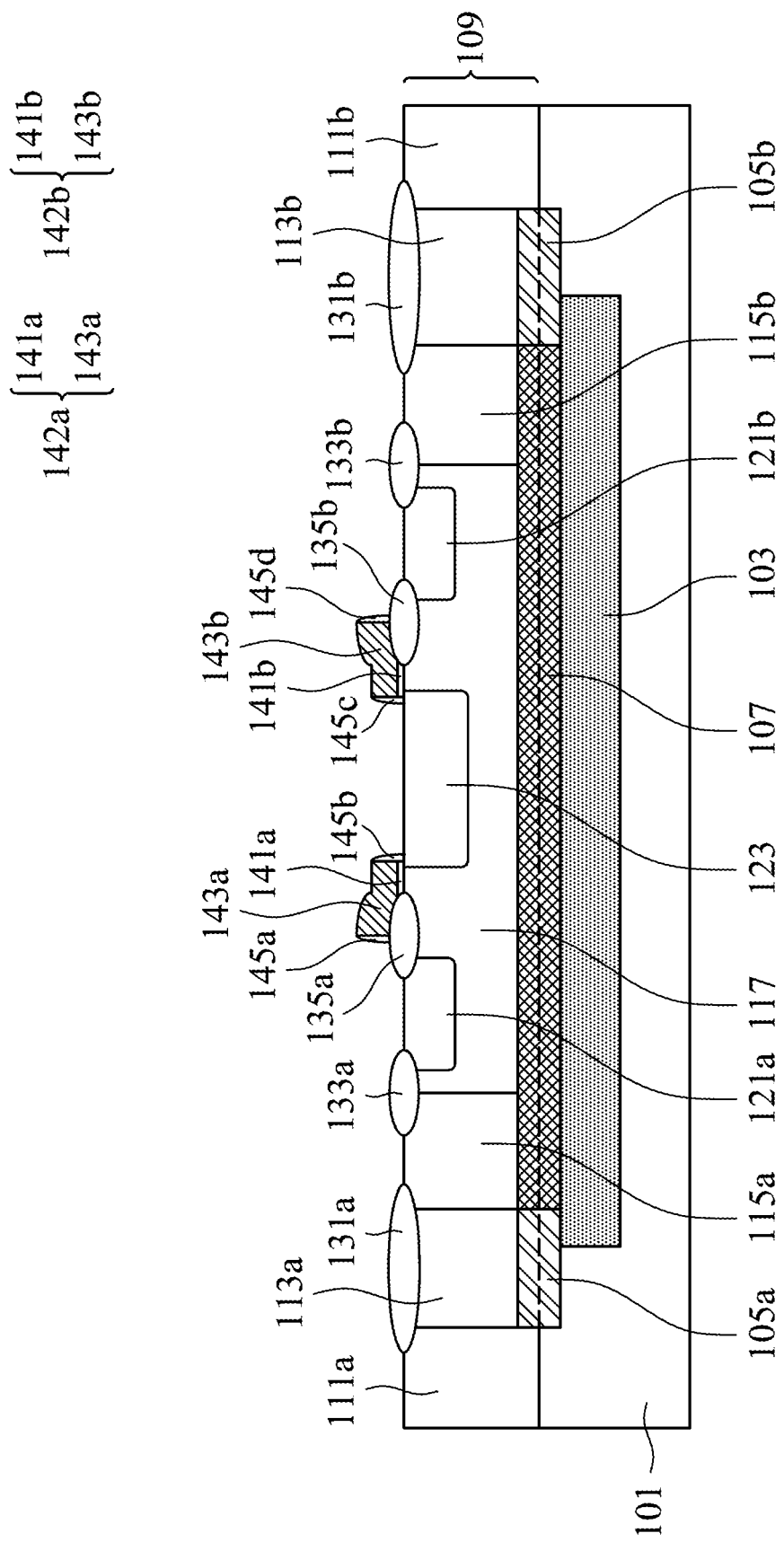

Then, as shown in FIG. 1E, after the isolation structures 131a, 131b, 133a, 133b, 135a and 135b are formed, a gate structure 142a (also called the first gate structure) and a gate structure 142b (also called the second gate structure) are formed on the epitaxial layer 109. The gate structure 142a includes a gate dielectric layer 141a and a gate electrode layer 143a, and the gate structure 142b includes a gate dielectric layer 141b and a gate electrode layer 143b. In addition, a spacer 145a and a spacer 145b are formed at opposite sides of the gate structure 142a, and a spacer 145c and a spacer 145d are formed at opposite sides of the gate structure 142b.

In some embodiments, the gate structure 142a extends from the well region 123 onto the isolation structure 135a, and the gate structure 142a covers a portion of the well region 123 and a portion of the second high-voltage well region 117. The gate structure 142b extends from the well region 123 onto the isolation structure 135b, and the gate structure 142b covers a portion of the well region 123 and a portion of the second high-voltage well region 117.

The method of forming the gate structures 142a and 142b may include sequentially and conformally depositing a dielectric material layer and a conductive material layer on the epitaxial layer 109. Then, the dielectric material layer and the conductive material layer are patterned by a photolithography process and an etching process. As a result, the gate structure 142a including the gate dielectric layer 141a and the gate electrode layer 143a, and the gate structure 142b including the gate dielectric layer 141b and the gate electrode layer 143b are formed.

In addition, the materials of the dielectric material layer (i.e. the materials of the gate dielectric layers 141a and 141b) may include silicon oxide, silicon nitride, silicon oxynitride, dielectric material(s) with high dielectric constant (high-k), a combination thereof, or another applicable dielectric material. In some embodiments, the dielectric material layer may be formed by a chemical vapor deposition (CVD) process, or a spin coating process. The material of the conductive material layer (i.e. the materials of the gate conductive layers 143a and 143b) may include amorphous silicon, polycrystalline silicon, one of more kinds of metals, metal nitrides, conductive metal oxides, a combination thereof, or another applicable conductive material. The conductive material layer may be formed by a chemical vapor deposition (CVD) process, a sputtering process, a resistive thermal evaporation process, an electron beam evaporation process, or another applicable deposition process. In some embodiments, the spacers 145a, 145b, 145c and 145d may include insulating materials, and the spacers 145a, 145b, 145c and 145d may be formed by deposition processes.

Figure 1F:
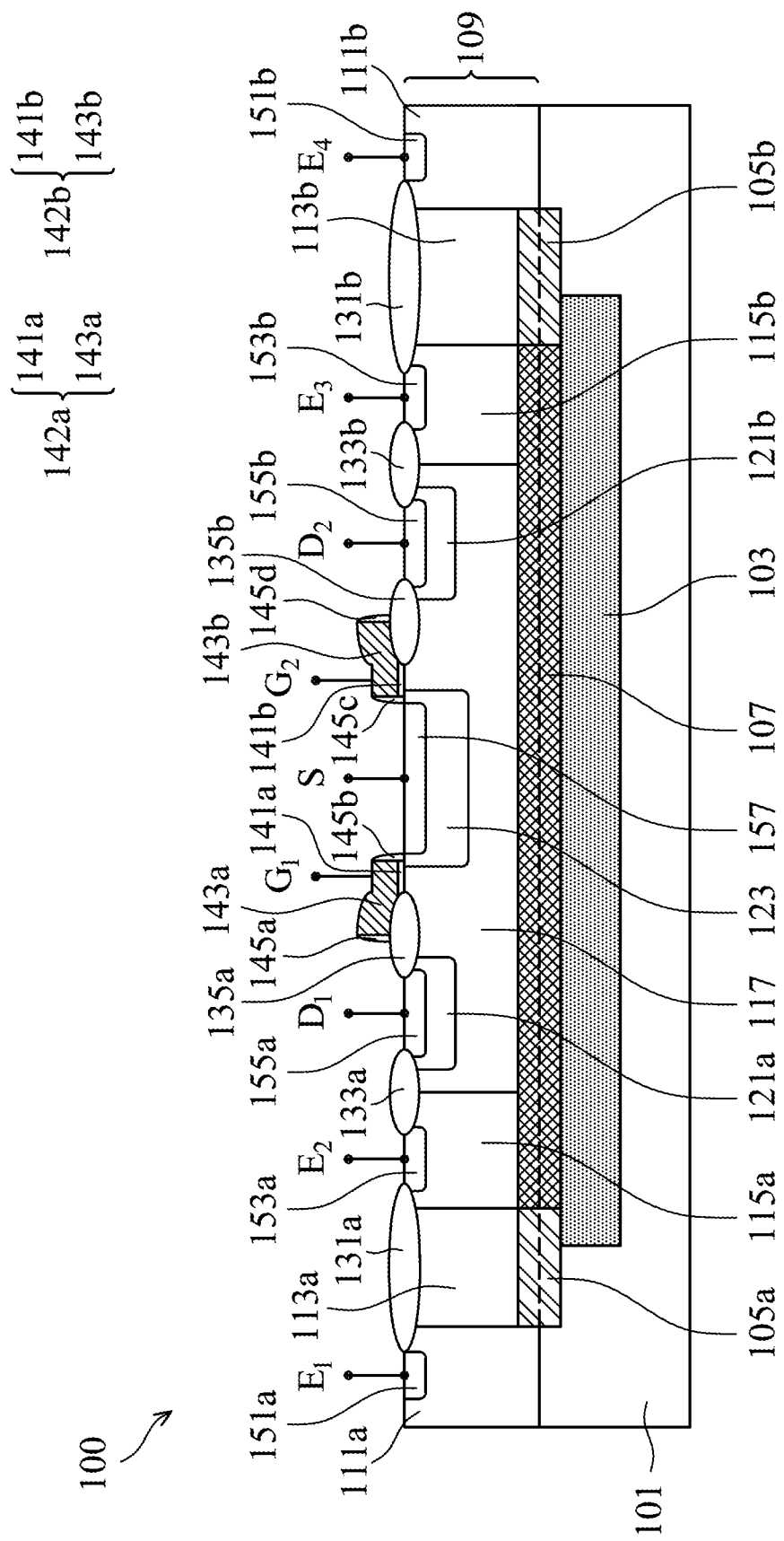

As shown in FIG. 1F, in accordance with some embodiments, a doped region 151a is formed in the high-voltage well region 111a, a doped region 153a is formed in the third high-voltage well region 115a, a doped region 155a is formed in the well region 121a, a doped region 157 is formed in the well region 123, a doped region 155b is formed in the well region 121b, a doped region 153b is formed in the fifth high-voltage well region 115b, and a doped region 151b is formed in the high-voltage well region 111b. In some embodiments, the doped regions 151a, 151b, 153a, 153b, 155a, 155b and 157 are formed after the gate structures 142a and 142b are formed.

More specifically, the doped region 153a is located between the isolation structure 131a and the isolation structure 133a. The doped region 155a is located between the isolation structure 133a and the isolation structure 135a. The doped region 157 is located between the gate structure 142a and the gate structure 142b. The doped region 155b is located between the isolation structure 133b and the isolation structure 135b, and the doped region 153b is located between the isolation structure 131b and the isolation structure 133b.

In the present embodiment, the doped regions 151a, 153a, 153b and 151b are p-type, and the doped regions 155a, 157 and 155b are n-type. The dopant concentrations of the doped regions 151a, 153a, 155a, 157, 155b, 153b and 151b are greater than the dopant concentrations of the well regions 121a, 123 and 121b. In some embodiments, the dopant concentrations of the doped regions 151a, 153a, 155a, 157, 155b, 153b and 151b are in a range from about $5 \times 10^{18}$ atoms/cm$^3$ to about $5 \times 10^{20}$ atoms/cm$^3$.

It should be noted that the doped region 157 may be the source region of the high-voltage semiconductor device 100, and the doped regions 155a and 155b may be the drain regions of the high-voltage semiconductor device 100 (the doped region 155a is also called the first drain region, and the doped region 155b is also called second drain region). Moreover, the source region 157, the first drain region 155a and the second drain region 155b are located in the second high-voltage well region 117, and the source region 157, the first drain region 155a, the second drain region 155b and the second high-voltage well region 117 have the same conductivity type.

In some embodiments, the high-voltage semiconductor device 100 includes dielectric layers (not shown) on the epitaxial layer 109. The dielectric layers on the epitaxial layer 109 include a multilayer structure made of several dielectric materials, such as silicon oxide, silicon nitride, silicon oxynitride, phosphosilicate glass (PSG), borophosphosilicate glass (BPSG), dielectric material(s) with low dielectric constant (low-k) or another applicable dielectric material. In addition, the high-voltage semiconductor device 100 includes an interconnect structure (not shown) disposed in the dielectric layers, and multiple electrodes disposed on the interconnect structure.

More specifically, the doped region 151a is electrically connected to the electrode $E_1$ (also called the substrate electrode) by the interconnect structure. The doped region 153a is electrically connected to the electrode $E_2$ by the interconnect structure. The first drain region 155a is electrically connected to the electrode $D_1$ (also called the first drain electrode) by the interconnect structure. The source region 157 is electrically connected to the electrode S (also called the source electrode) by the interconnect structure. The second drain region 155b is electrically connected to the electrode $D_2$ (also called the second drain electrode) by the interconnect structure. The doped region 153b is electrically connected to the electrode $E_3$ by the interconnect structure. The doped region 151b is electrically connected to the electrode $E_4$ (also called the substrate electrode) by the interconnect structure.

In addition, the gate structure 142a and the gate structure 142b are respectively electrically connected to the electrode $G_1$ and the electrode $G_2$ ($G_1$ and $G_2$ are also called the gate electrodes) by the interconnect structure. The high-voltage semiconductor device 100 is complete after the electrodes $E_1$, $E_2$, $D_1$, $D_2$, $E_3$, $E_4$, $G_1$, $G_2$ and S are formed.

Figure 2:
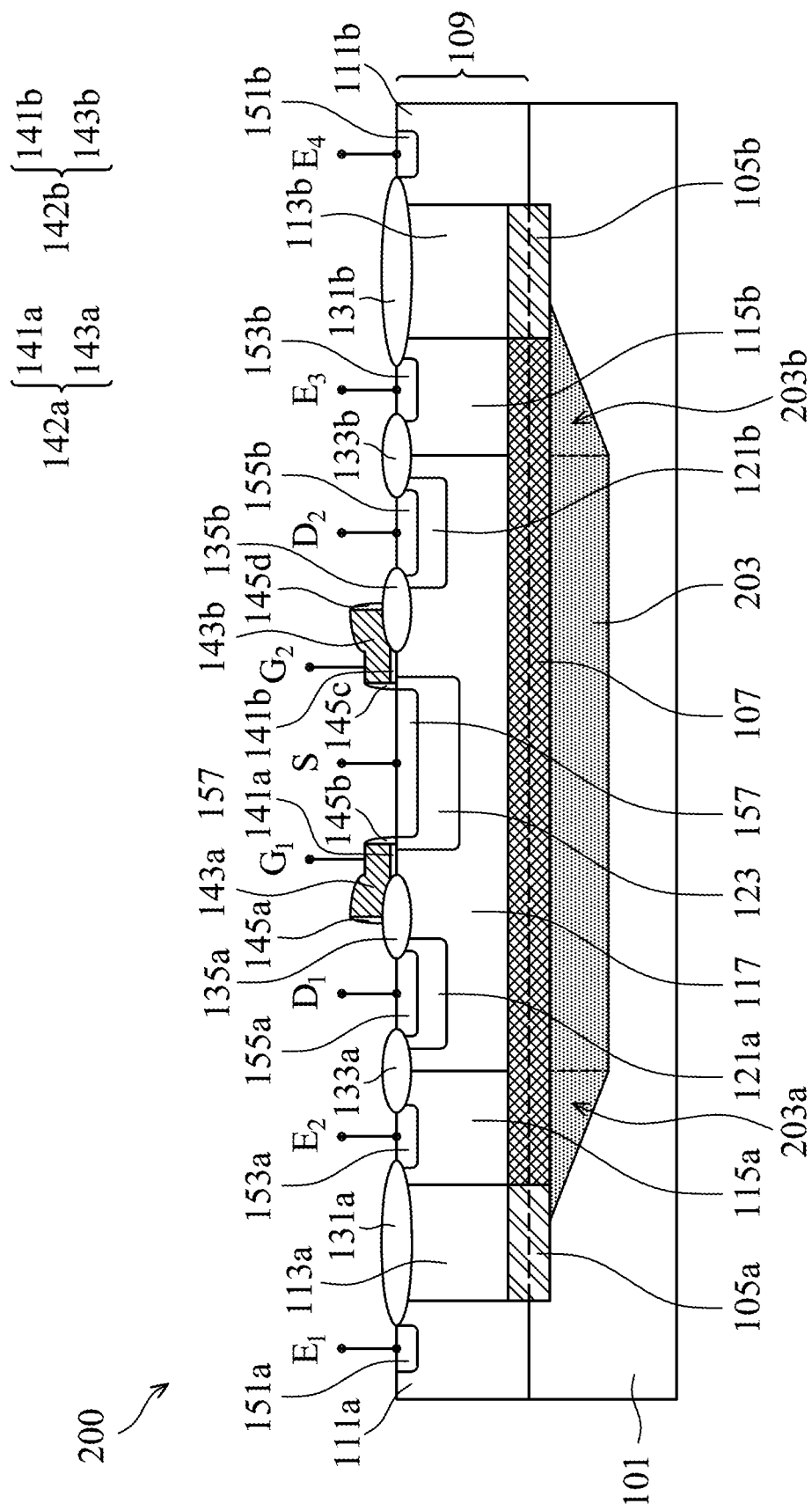
FIG. 2 is a cross-sectional view of a high-voltage semiconductor device in accordance with some other embodiments of the disclosure.

FIG. 2 is a cross-sectional view of a high-voltage semiconductor device 200 in accordance with some embodiments of the disclosure. The difference between the high-voltage semiconductor device 200 and the high-voltage semiconductor device 100 is that the shape of the first high-voltage well region 203 is different from the shape of the first high-voltage well region 103. Processes and materials for forming the other elements of the high-voltage semiconductor device 200 are similar to, or the same as, those for forming the high-voltage semiconductor device 100, and are not repeated herein.

As shown in FIG. 2, in the high-voltage semiconductor device 200, the portion of the first high-voltage well region 203, which overlaps the second high-voltage well region 117, has the same thickness. It should be noted that the two opposite sides of the first high-voltage well region 203 have the first tapered portion 203a and the second tapered portion 203b respectively. The first tapered portion 203a has a thickness tapered along a direction from the first high-voltage well region 203 to the second buried layer 105a, and the second tapered portion 203b has a thickness tapered along a direction from the first high-voltage well region 203 to the third buried layer 105b. Moreover, the first tapered portion 203a adjoins the first buried layer 107 and the second buried layer 105a, and the second tapered portion 203b adjoins the first buried layer 107 and the third buried layer 105b.

In some embodiments, the length of the bottommost surface of the first high-voltage well region 203 is the same as the length of the bottom surface of the second high-voltage well region 117. In other words, the interface between the portion of the first high-voltage well region 203 having the same thickness and the first tapered portion 203a is aligned with the interface between the third high-voltage well region 115a and the second high-voltage well region 117, and the interface between the portion of the first high-voltage well region 203 having the same thickness and the second tapered portion 203b is aligned with the interface between the fifth high-voltage well region 115b and the second high-voltage well region 117. The range of the process concentration of the first buried layer 107 may be flexibly adjusted by the above-mentioned structure, and the current leakage problem caused by depletion may not happen easily.

Figure 3:
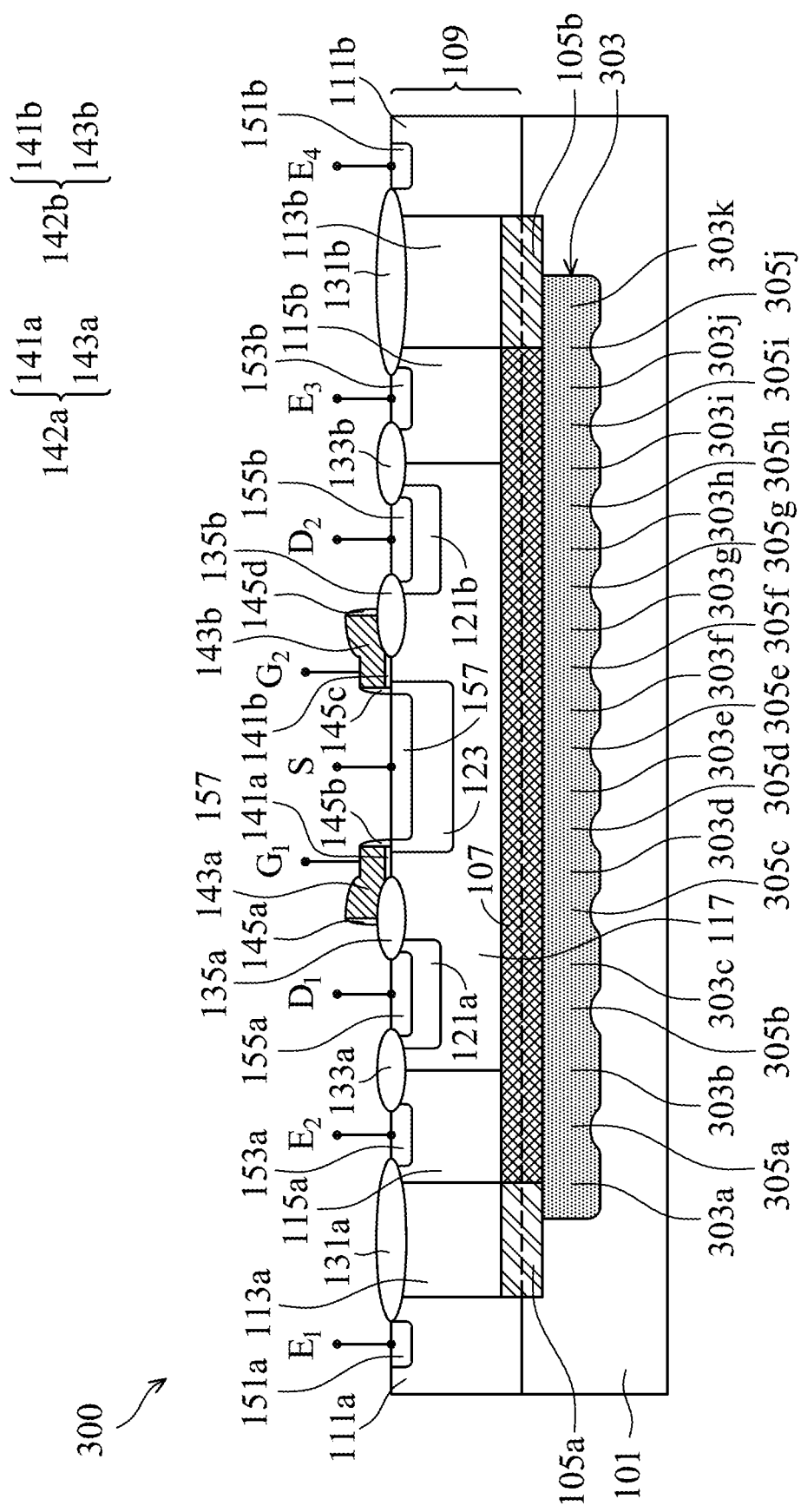
FIG. 3 is a cross-sectional view of a high-voltage semiconductor device in accordance with some other embodiments of the disclosure.

FIG. 3 is a cross-sectional view of a high-voltage semiconductor device 300 in accordance with some embodiments of the disclosure. The difference between the high-voltage semiconductor device 300 and the high-voltage semiconductor device 100 is that the shape of the first high-voltage well region 303 is different from the shape of the first high-voltage well region 103. Processes and materials for forming the other elements of the high-voltage semiconductor device 300 are similar to, or the same as, those for forming the high-voltage semiconductor device 100, and are not repeated herein.

As shown in FIG. 3, the first high-voltage well region 303 of the high-voltage semiconductor device 300 includes multiple segments and multiple connecting portions, such as segments 303a, 303b, 303c, 303d, 303e, 303f, 303g, 303h, 303i, 303j and 303k, and connecting portions 305a, 305b, 305c, 305d, 305e, 305f, 305g, 305h, 305i and 305j. The segments 303a-303k are connected to each other by the connecting portions 305a-305j.

In some embodiments, the method of forming the first high-voltage well region 303 includes performing an ion implantation process by using a patterned photoresist to form multiple discontinuous segments (not shown) in the semiconductor substrate 101. Then, a thermal treatment process is performed (i.e. drive-in process) so that the ions implanted in the segments diffuse outwardly to connect with each other. It should be noted that the dopant concentrations of each segment can be adjusted in the method of forming the first high-voltage well region 303 having multiple discontinuous segments. As a result, the properties of the high-voltage semiconductor device 300 may be adjusted more precisely from the processes.

Embodiments of high-voltage semiconductor devices are provided in this disclosure, especially the embodiments of laterally diffused metal oxide semiconductor (LDMOS) transistors. In some embodiments of the present disclosure, a first high-voltage well region is disposed in a semiconductor substrate, the semiconductor substrate has a first conductivity type, and the first high-voltage well region has a second conductivity type that is opposite to the first conductivity type. A first buried layer, a second buried layer and a third buried layer are disposed on the first high-voltage well region. The first buried layer is located between the second buried layer and the third buried layer. The first buried layer has the first conductivity type, and the second buried layer and the third buried layer have the second conductivity type. In addition, a second high-voltage well region having the second conductivity type is disposed on the first buried layer, and a source region and a drain region having the second conductivity type are disposed in the second high-voltage well region.

The first high-voltage well region extends to the location below the second buried layer and the third buried layer. Therefore, a semiconductor device having high breakdown voltage is formed on the first high-voltage well region and is fully isolated from the semiconductor substrate. Moreover, since the first buried layer is disposed between the first high-voltage well region and the second high-voltage well region, the semiconductor device can withstand high voltage by utilizing the first high-voltage well region, and the semiconductor device can provide the voltage which is required to operate the semiconductor device itself. The laterally diffused metal oxide semiconductor transistor having high breakdown voltage can be widely applied in the chips of level shifters and high-voltage integrated circuits (HVICs). In addition, since the source region and the drain region are both disposed in the second high-voltage well region, the on-resistance ($R_{on}$) of the semiconductor device may be reduced. As a result, the on-state current of the laterally diffused metal oxide semiconductor transistor may be increased.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A high-voltage semiconductor device, comprising:
a semiconductor substrate having a first conductivity type;

a first high-voltage well region disposed in the semiconductor substrate and having a second conductivity type that is opposite to the first conductivity type;
a first buried layer disposed on the first high-voltage well region and having the first conductivity type;
a second buried layer and a third buried layer disposed on the first high-voltage well region and having the second conductivity type, wherein the first buried layer is between the second buried layer and the third buried layer, the first buried layer is in direct contact with the second buried layer, bottom surfaces of the second buried layer and the third buried layer are in direct contact with both the first high-voltage well region and the semiconductor substrate; and
a source region and a drain region disposed on the first buried layer and having the second conductivity type.

2. The high-voltage semiconductor device as claimed in claim 1, further comprising:
an epitaxial layer disposed on the semiconductor substrate, wherein the first buried layer, the second buried layer and the third buried layer extend from the semiconductor substrate into the epitaxial layer.

3. The high-voltage semiconductor device as claimed in claim 1, further comprising:
a second high-voltage well region disposed in an epitaxial layer and having the second conductivity type, wherein the source region and the drain region are located in the second high-voltage region; and
a gate structure disposed on the epitaxial layer and between the source region and the drain region.

4. The high-voltage semiconductor device as claimed in claim 3, wherein the first buried layer is sandwiched between the first high-voltage well region and the second high-voltage well region.

5. The high-voltage semiconductor device as claimed in claim 1, wherein the first high-voltage well region adjoins the second buried layer and the third buried layer.

6. The high-voltage semiconductor device as claimed in claim 1, wherein the first high-voltage well region has a first tapered portion and a second tapered portion at opposite sides of the first high-voltage well region, the first tapered portion is tapered along a direction from the first high-voltage well region to the second buried layer, and the second tapered portion is tapered along a direction from the first high-voltage well region to the third buried layer, and
wherein the first tapered portion and the second tapered portion respectively adjoin the second buried layer and the third buried layer.

7. The high-voltage semiconductor device as claimed in claim 1, wherein the first high-voltage well region comprises a plurality of segments, each adjacent pair of segments are connected by a connecting portion, and the connecting portion has a thickness that is smaller than that of the segments.

8. A high-voltage semiconductor device, comprising:
a semiconductor substrate having a first conductivity type;
a first high-voltage well region disposed in the semiconductor substrate and having a second conductivity type that is opposite to the first conductivity type;
a first buried layer disposed on the first high-voltage well region and having the first conductivity type;
a second high-voltage well region disposed on the first buried layer and having the second conductivity type; and
a source region and a first drain region disposed in the second high-voltage well region and having the second conductivity type;
a second buried layer disposed on the first high-voltage well region and having the second conductivity type, wherein the second buried layer adjoins the first buried layer, and the first high-voltage well region extends below the second buried layer, the first buried layer is in direct contact with the second buried layer, and a bottom surface of the second buried layer is in direct contact with both the first high-voltage well region and the semiconductor substrate.

9. The high-voltage semiconductor device as claimed in claim 8, further comprising:
a second drain region disposed in the second high-voltage well region and having the second conductivity type, wherein the source region is between the first drain region and the second drain region;
a first gate structure disposed on the semiconductor substrate and between the first drain region and the source region; and
a second gate structure disposed on the semiconductor substrate and between the source region and the second drain region.

10. The high-voltage semiconductor device as claimed in claim 8, further comprising:
an epitaxial layer disposed on the semiconductor substrate, wherein the second high-voltage well region and a portion of the first buried layer are disposed in the epitaxial layer.

11. The high-voltage semiconductor device as claimed in claim 8, wherein a dopant concentration of the first buried layer is greater than a dopant concentration of the first high-voltage well region.

12. The high-voltage semiconductor device as claimed in claim 8, further comprising:
a third high-voltage well region adjoining the second high-voltage well region and having the first conductivity type, wherein the first buried layer and the first high-voltage well region extend below the third high-voltage well region.

13. The high-voltage semiconductor device as claimed in claim 12, further comprising:
a fourth high-voltage well region disposed on the second buried layer and having the second conductivity type, wherein the third high-voltage well region is between the fourth high-voltage well region and the second high-voltage well region.

14. The high-voltage semiconductor device as claimed in claim 13, further comprising:
a fifth high-voltage well region adjoining the second high-voltage well region and having the first conductivity type, wherein the second high-voltage well region is between the fifth high-voltage well region and the third high-voltage well region;
a third buried layer disposed on the first high-voltage well region and having the second conductivity type, wherein the first buried layer is between the second buried layer and the third buried layer; and
a sixth high-voltage well region disposed on the third buried layer and having the second conductivity type, wherein the fifth high-voltage well region is between the second high-voltage well region and the sixth high-voltage well region, and the first high-voltage well region extends below the sixth high-voltage well region.

15. A method for manufacturing a high-voltage semiconductor device, further comprising:
forming a first high-voltage well region in a semiconductor substrate, wherein the semiconductor substrate has a first conductivity type, and the first high-voltage well region has a second conductivity type that is opposite to the first conductivity type;

forming a first buried layer on the first high-voltage well region, wherein the first buried layer has the first conductivity type;

forming a second buried layer and a third buried layer at opposite sides of the first buried layer, wherein the second buried layer and the third buried layer have the second conductivity type, the first buried layer is in direct contact with the second buried layer, and bottom surfaces of the second buried layer and the third buried layer are in direct contact with both the first high-voltage well region and the semiconductor substrate;

forming an epitaxial layer on the semiconductor substrate, wherein the first buried layer, the second buried layer and the third buried layer extend into the epitaxial layer; and forming a source region and a drain region in the epitaxial layer and on the first buried layer, wherein the source region and the drain region have the second conductivity type.

16. The method as claimed in claim 15, wherein the first high-voltage well region extends from a location below the first buried layer to a location below the second buried layer and the third buried layer, and the first high-voltage well region adjoins the second buried layer and the third buried layer.

17. The method as claimed in claim 15, wherein a dopant concentration of the first buried layer is greater than a dopant concentration of the first high-voltage well region.

18. The method as claimed in claim 15, further comprising:

forming a second high-voltage well region in the epitaxial layer and on the first buried layer, wherein the second high-voltage well region has the second conductivity type, the source region and the drain region are located in the second high-voltage well region, and the first buried layer is sandwiched between the first high-voltage well region and the second high-voltage well region.

19. The method as claimed in claim 18, wherein a dopant concentration of the second buried layer, a dopant concentration of the third buried layer, and a dopant concentration of the second high-voltage well region are greater than a dopant concentration of the first high-voltage well region.

20. The method as claimed in claim 18, further comprising:

forming a third high-voltage well region and a fourth high-voltage well region in the epitaxial layer and on the first buried layer, wherein the third high-voltage well region has the first conductivity type, and the fourth high-voltage well region has the second conductivity type, and wherein the third high-voltage well region is between the second high-voltage well region and the fourth high-voltage well region, and the fourth high-voltage well region adjoins the second buried layer.

* * * * *